(12) United States Patent
Kim et al.

(10) Patent No.: US 7,415,402 B2
(45) Date of Patent: Aug. 19, 2008

(54) SIMULATION BASED PSM CLEAR DEFECT REPAIR METHOD AND SYSTEM

(75) Inventors: Juhwan Kim, Pleasanton, CA (US); Keun-Young Kim, Union City, CA (US)

(73) Assignee: Synopsys, Inc., Mountain View, CA (US)

( * ) Notice: Subject to any disclaimer, the term of this patent is extended or adjusted under 35 U.S.C. 154(b) by 529 days.

(21) Appl. No.: 11/121,498

(22) Filed: May 3, 2005

(65) Prior Publication Data
US 2005/0196688 A1   Sep. 8, 2005

Related U.S. Application Data

(62) Division of application No. 10/364,260, filed on Feb. 11, 2003, now Pat. No. 6,927,003.

(51) Int. Cl.
*G06F 17/50* (2006.01)
(52) U.S. Cl. ........................................................ 703/13
(58) Field of Classification Search .................... 430/5; 250/492.2; 703/13; 716/19, 21
See application file for complete search history.

(56) References Cited

U.S. PATENT DOCUMENTS

| 6,578,188 | B1 | 6/2003 | Pang et al. |
| 6,880,135 | B2 * | 4/2005 | Chang et al. ................... 716/4 |
| 2004/0151991 | A1 | 8/2004 | Stewart et al. |

* cited by examiner

*Primary Examiner*—Stephen Rosasco
(74) *Attorney, Agent, or Firm*—Bever, Hoffman & Harms, LLP; Jeanette S. Harms

(57) ABSTRACT

Mask shops typically use carbon to repair any clear defects identified on a mask, irrespective of the type of mask. However, carbon can have different characteristics than the original patterning material on the mask. Therefore, a mask that is repaired using carbon may not optically perform as if it were defect-free. An automated method of repairing a clear defect on an attenuated phase shifting mask (PSM) provides an optimized plug size/shape. In this method, a repair solution to the clear defect can be simulated, thereby allowing the repair decision for an attenuated PSM to be advantageously made at the same time that inspection is done and before actual repair. Simulation can include performing model-based OPC on the repair solution.

11 Claims, 6 Drawing Sheets

SIMULATION BASED PSM CLEAR DEFECT REPAIR METHOD AND SYSTEM

RELATED APPLICATION

This application is a divisional of U.S. patent application Ser. No. 10/364,260 entitled "Simulation Based PSM Clear Defect Repair Method And System" filed Feb. 11, 2003.

BACKGROUND OF THE INVENTION

1. Field of the Invention

The present invention relates to a phase shifting mask (PSM) and in particular to a simulation based repair technique for clear defects on an attenuated PSM.

2. Discussion of the Related Art

Photolithography is a well-known process used in the semiconductor industry to form lines, contacts, and other known structures in integrated circuits (ICs). In conventional photolithography, a mask (or a reticle) having a pattern of transparent and opaque regions representing such structures in one IC layer is illuminated. For example, FIG. 1 illustrates a cross section of a binary mask 100 having a transparent substrate 101 and a plurality of opaque (e.g. chrome) regions 102 formed on transparent substrate 101. During an exposure operation, a radiation source 103 is directed at mask 100. The emanating light from mask 100 is then focused on a photoresist layer provided on a wafer. During a subsequent development process, portions of the photoresist layer are removed, wherein the portions are defined by the pattern. In this manner, the pattern of mask 100 can be transferred to or printed on the photoresist layer.

FIG. 2 illustrates an attenuated phase shifting mask (PSM) 200 that uses phase destructive interference of the waves of incident light to transfer its pattern. Generally, phase-shifting shifts the phase of a first region of incident light waves approximately 180 degrees relative to a second, adjacent region of incident light waves to create a sharply defined interface between the first and second regions. For example, PSM 200 includes clear regions 202 and attenuated phase shifting regions 201. The phase shift of light passing through an attenuated phase shifting region 201 relative to light passing through a clear region 202 is approximately 180 degrees. Clear regions 202 are transparent, i.e. regions having an optical intensity transmission coefficient T>0.9. In contrast, attenuated phase-shifting regions 201 are partially transparent, i.e. regions having a low optical intensity transmission coefficient $0.03 < T < 0.2$.

Unfortunately, because of the difficulty in providing a perfect mask fabrication process, at least some defects can be found on most masks. In general, a defect on a mask is anything that is different from the design database and is deemed out of tolerance by an inspection tool or an inspection engineer. Common mask defects include, for example, an isolated opaque pinhole defect in a clear region, an isolated clear spot defect in an opaque/attenuated region, an edge intrusion defect in an opaque/attenuated region, an edge protrusion defect in a clear region, a geometry break defect in an opaque/attenuated region, and a geometry bridge defect in a clear region.

Repairing defects in the clear regions, i.e. removal of material from regions in which the material does not belong, can be easily and accurately performed on both the binary mask as well as the attenuated PSM with a focused laser beam.

FIG. 4A illustrates a conventional process 400 for repairing clear defects on a generic (e.g. a binary or an attenuated PSM) mask. In process 400, after writing the mask with the desired pattern, the mask can be inspected in step 401. The inspection can include scanning the surface of the mask with a high-resolution microscope and capturing images of the mask. Step 402 determines whether a clear defect is found. If so, then step 403 determines whether the printing of this clear defect is not out of tolerance. Note that the goal of inspection is to correctly identify a defect to avoid a failed wafer processing. However, not all mask defects are important with respect to the desired result, i.e. an accurate representation of the original design layout on the photoresist material or etched into silicon. Specifically, not all mask defects will "print." The printability of a defect is how a defect would impact the outcome of a given photolithography and/or etching process. If the printing is not out of tolerance, then the mask can be approved (called CD registration) in step 405.

However, if the printing of the clear defect is out of tolerance, then step 404 determines whether that clear defect can be repaired. Note that such a designation might be contingent on the amount that the defect is out of tolerance or number of clear defects found in close proximity to each other. For example, the more defects found adjacent the clear defect, the greater the probability that the mask cannot be repaired in a cost efficient manner. Specifically, if clear defects are close to each other, then the aerial images of the patterns are correlated when they are repaired. This correlation makes the repair process control more complex, thereby increasing the difficulty of repair. Moreover, if the total number of defects on the mask is more than a predetermined amount, then repair of the mask is also not cost effective. If the clear defect is not repairable, then the mask is disqualified in step 406.

If the clear defect is repairable, then material can be deposited in the area identified as the clear defect in step 407. For example, FIG. 4B illustrates one repair solution to attenuated PSM 300. Specifically, in repaired mask 410, clear defect 302 has been filled in using a "plug" 411. Note that the exterior edges of plug 411 are substantially collinear with the edges of line 301. After cleaning the mask in step 408, process 400 can return to step 402 to identify other clear defects, if present. Otherwise, process 400 can end.

Of importance, sputtering tools, which are used to repair clear defects on masks (i.e. adding of material to regions in which the material does belong), can easily and accurately deposit carbon, but not other materials. Thus, neither chrome, which is typically used to form opaque regions 102 in binary mask 100 (FIG. 1), nor molybdenum silicide, which is typically used to form attenuated phase shifting regions 201 in attenuated PSM 200, can be used to repair clear defects.

The use of carbon to repair a clear defect on a binary mask is satisfactory because the intensity transmission coefficient of the opaque (e.g. chrome) regions and of the deposited carbon is identical, i.e. T<0.01. Thus, the repair solution in the binary mask accurately emulates a defect-free clear region. However, the use of carbon to repair a clear defect on an attenuated PSM is sub-optimal because the intensity transmission coefficient of the attenuated regions is significantly higher than for the deposited carbon. For example, the intensity transmission coefficient of molybdenum silicide is approximately T=0.03-0.2. Thus, carbon would fail to provide the desired phase shift on the attenuated PSM.

Without the appropriate phase shift, the printing of a feature on a wafer using attenuated PSM 410 may be out of tolerance. For example, FIG. 5 illustrates an aerial image 500 of a wafer printed using attenuated PSM 410. Note that printed line 501, which corresponds to attenuated line 301 and carbon plug 411 (see FIG. 4B), has not accurately printed. Specifically, printed line 501 is thinner at location 502, which is the area associated with carbon plug 411.

To address this problem, mask shops can collect experimental data on various plug shapes and sizes by exposing a test mask and then analyzing the resulting printed features on the developed wafer. This experimental data can be expanded to include multiple test masks exposed under various stepper scanner conditions, which can significantly impact the printability of such features on the wafer. These conditions can include: wavelength, numerical aperture, coherence factor, illumination mode, exposure time, and exposure focus/defocus among others. Unfortunately, the collection of this experimental data requires the use of expensive mask writing and exposure tools, valuable blank wafers (which could otherwise be used for integrated circuits), as well as the time-consuming analysis of a skilled engineer, thereby rendering an empirical approach impractical for commercial mask production.

Therefore, when asked to propose a repair solution for a clear defect on an attenuating PSM, an engineer may attempt to compensate for the lack of phase effect by arbitrarily increasing the plug size a predetermined amount for all clear defects on the mask. For example, FIG. 6 illustrates another repair solution to attenuated PSM 300. Specifically, repaired mask 600 includes a carbon plug 601 that is significantly larger than plug 411 (FIG. 4B). However, without the benefit of empirical data, the engineer cannot know whether the size and/or shape of plug 601 will result in a printed feature within tolerance. This uncertainty has contributed to the reluctance of many mask shops to use attenuated PSM technology, despite the fact that an attenuated PSM can provide more smaller, more sharply defined features than a binary mask.

Therefore, a need arises for an automated technique to provide accurate repairs to clear defects on an attenuated PSM.

SUMMARY OF THE INVENTION

Mask shops typically use carbon to repair any clear defects identified on a mask, irrespective of the type of mask. The transparency of carbon, called its intensity transmission coefficient in the mask fabrication industry, is not necessarily the same as the patterning material used on the mask. Therefore, a mask that is repaired using carbon may not optically perform as if it were defect-free.

For example, the patterning material used on an attenuating phase shifting mask (PSM) typically has an intensity transmission coefficient significantly higher than that for carbon. For example, the intensity transmission coefficient of molybdenum silicide, one attenuated material, is approximately T=0.03-0.2, whereas the intensity transmission coefficient of carbon is T<0.01. As a result of this difference in the intensity transmission coefficient, carbon can fail to provide the desired phase shift on the attenuated PSM unless the size and/or shape of the "plug", i.e. the repair solution for the clear defect, can be accurately adjusted.

In accordance with one feature of the invention, an automated method of repairing a clear defect on an attenuated phase shifting mask (PSM) provides an optimized plug size/shape. In this method, a repair solution to the clear defect can be simulated, thereby allowing the repair decision for an attenuated PSM to be made at the same time that inspection is done and before actual repair. In a conventional attenuated PSM repair process, after determining the feature corresponding to the clear defect is out of tolerance, but repairable, the mask is taken out of the production line for further analysis. Thus, a conventional process for repairing an attenuated PSM requires manual intervention by a human operator, thereby increasing the cost of the repair. In contrast, the method including the simulation based repair solution can be easily integrated into a fully automated repair process for an attenuated PSM, thereby significantly reducing the cost of repair compared to a conventional repair process.

Moreover, of importance, the repair solution can be based on the transmission of the repair material versus the transmission of the attenuated material used for patterning the attenuated PSM. Therefore, using the simulation, the size and/or shape of the repair solution can be quickly and accurately customized. As a result, the repair material can be deposited on the attenuated PSM based on an optimized repair solution. Of importance, although described in reference to an attenuated PSM, this simulation based deposition area optimization can be applied to any clear defect repair in which the repair material has different characteristics than the original patterning material on the mask.

Because a clear defect that is actually repaired using the simulation based deposition area optimization is known to be successful, more attenuated PSMs will be repaired rather than being rejected, thereby increasing the yield for this type of mask. Additionally, the more attenuated PSMs that can be successfully and quickly repaired increases the probability that mask shops will recommend the use of attenuated PSMs, thereby providing significant production advantages to the end users.

In one embodiment, simulating includes performing model-based optical proximity correction (OPC) on the repair solution. Performing model-based OPC can include dissecting edges of the plug into a plurality of segments and moving at least one segment to optimize at least one of the size and shape of the plug. This movement of segments can result in one or more edges of the plug having a "step" formation. Note that edges of the plug can have different step formations. In one embodiment, the optimized step formation can compensate for a proximity effect on the attenuated PSM.

A system for repairing a clear defect on a mask using the simulation based deposition area optimization is also provided. The system includes means for simulating a repair solution to the clear defect, means for determining a size and/or a shape of the repair solution, and means for depositing the repair material on the attenuated PSM.

A computer program product is also provided. The computer program product includes a computer usable medium having a computer readable program code embodied therein for causing a computer to analyze a mask used in lithography for repair of a clear defect on the mask. The computer readable program code includes computer readable program code that simulates a repair solution to the clear defect, wherein the repair solution is based on a repair material having a transmission different than an original patterning material on the mask. The computer readable program code further includes computer readable program code that determines a size and/or a shape of the repair solution as well as computer readable program code that controls the depositing of the repair material on the attenuated PSM based on the size and/or shape of the repair solution.

DETAILED DESCRIPTION OF THE FIGURES

Binary masks are by far the most common type of mask being used in the semiconductor industry. Mask shops typically use carbon, which can easily be sputtered using conventional mask repair tools, to repair any clear defects identified on a binary mask. The transparency of carbon, called its intensity transmission coefficient in the industry, is the same as the opaque material (e.g. chrome) used to pattern binary masks. Therefore, a binary mask repaired using carbon can optically perform as if it were defect-free.

Because mask writing takes considerably longer than mask repair, a typical mask shop may have six mask writing tools, but only one mask repair tool. Moreover, because the mask writing process is much more complex than the mask repair process, mask writing tools are logically more expensive than mask repair tools. For example, a mask writing tool may cost on the order of $20 million dollars, whereas a mask repair tool may cost less than $5 million dollars. Therefore, the total investment of a mask shop in mask repair tools is significantly less than that for mask writing tools.

An attenuated phase shifting mask (PSM) can provide smaller and better-defined features than a binary mask. However, the repair of a clear defect on an attenuated PSM, in contrast to a binary mask, can pose significant challenges to a mask shop. Specifically, the intensity transmission coefficient of carbon is significantly different than the attenuated material on the attenuated PSM. Therefore, a clear defect on an attenuated PSM that is repaired using a carbon plug sized identically to the area defined by the clear defect or based on a generic upsizing across the mask could still result in printing a feature out of tolerance on the wafer. As a result of this uncertainty and the improbability of significant investment in new mask repair tools, mask shops are reluctant to embrace this new technology. Thus, end users are denied the advantages inherent in the attenuated PSM technology.

Figure 1:
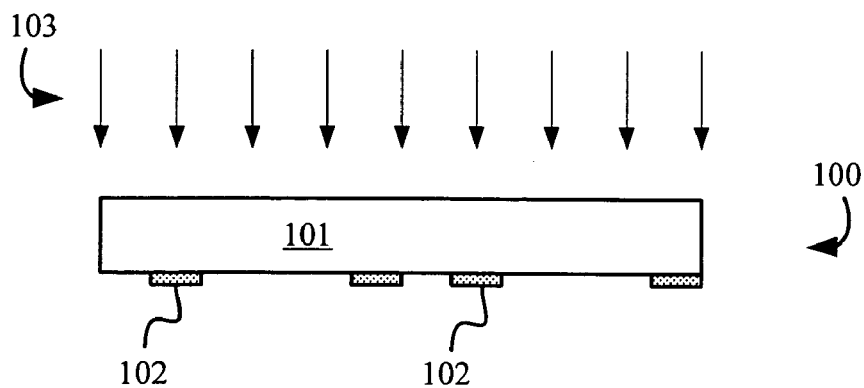
FIG. 1 illustrates a cross section of a binary mask having a transparent substrate and a plurality of opaque regions formed on the transparent substrate, wherein exposure of the binary mask transfers the pattern of the opaque regions to a wafer.
Figure 2:
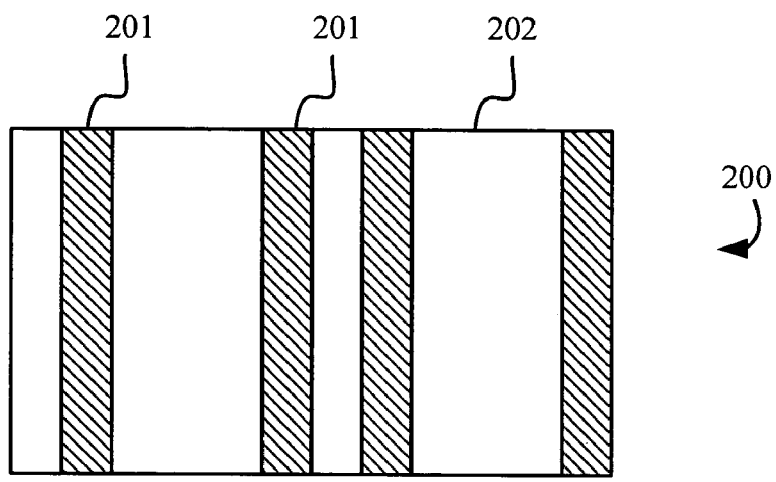
FIG. 2 illustrates an attenuated phase shifting mask (PSM) that uses phase destructive interference of the waves of incident light to transfer its pattern to a wafer.
Figure 3:
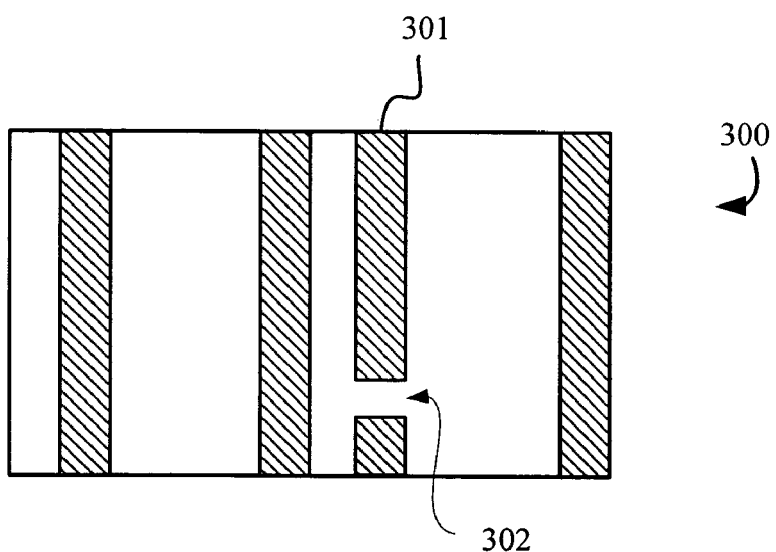
FIG. 3 illustrates an attenuated PSM including a geometry bridge (clear) defect in an attenuated region.
Figure 4A:
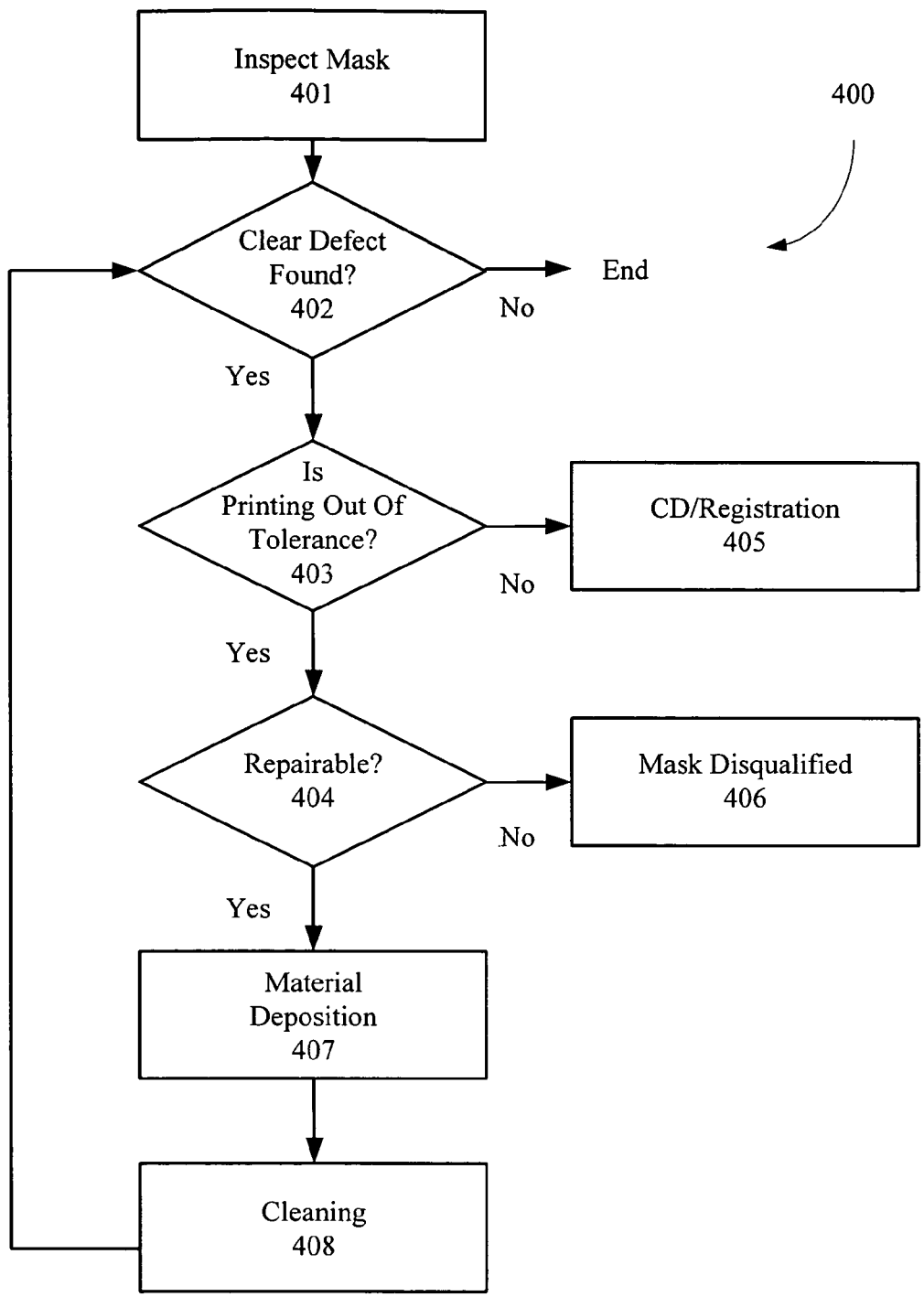
FIG. 4A illustrates a conventional process for repairing clear defects on either a binary mask or an attenuated PSM.
Figure 4B:
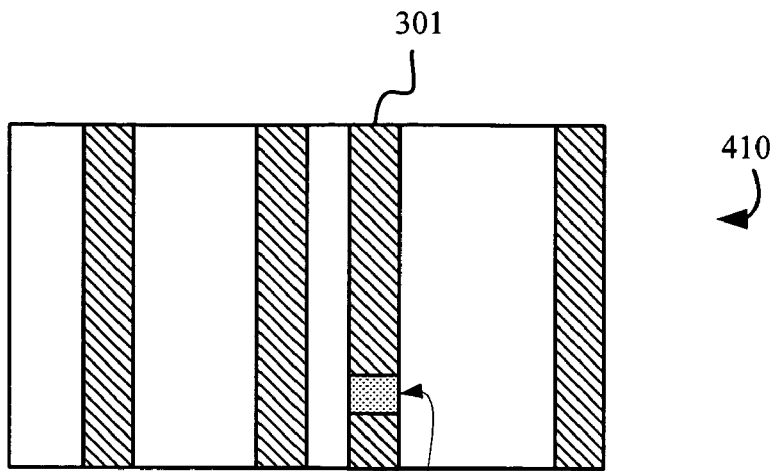
FIG. 4B illustrates one repair solution to the attenuated PSM of FIG. 3.
Figure 5:
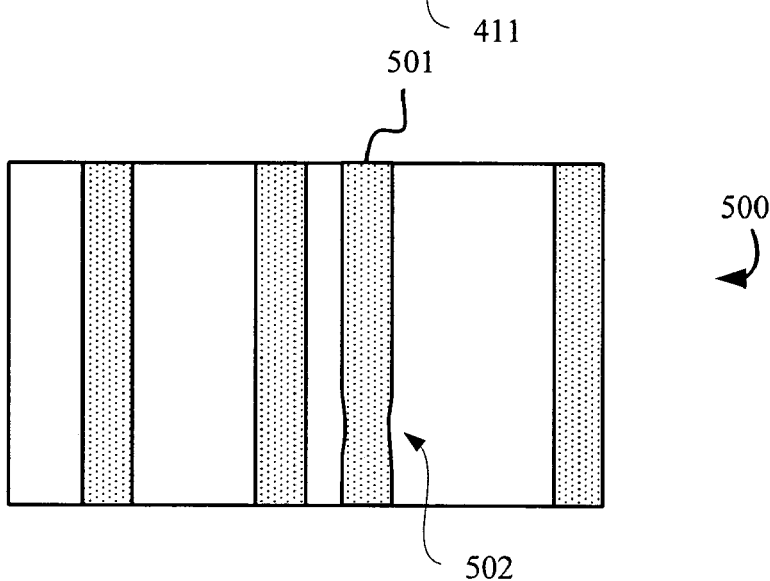
FIG. 5 illustrates an aerial image of a wafer printed from the repaired mask of FIG. 4B.
Figure 6:
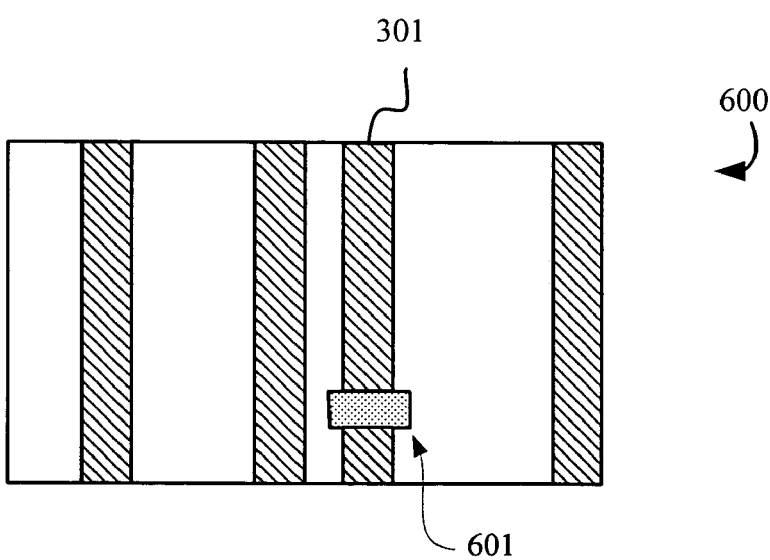
FIG. 6 illustrates another repair solution to the attenuated PSM of FIG. 3.
Figure 7:
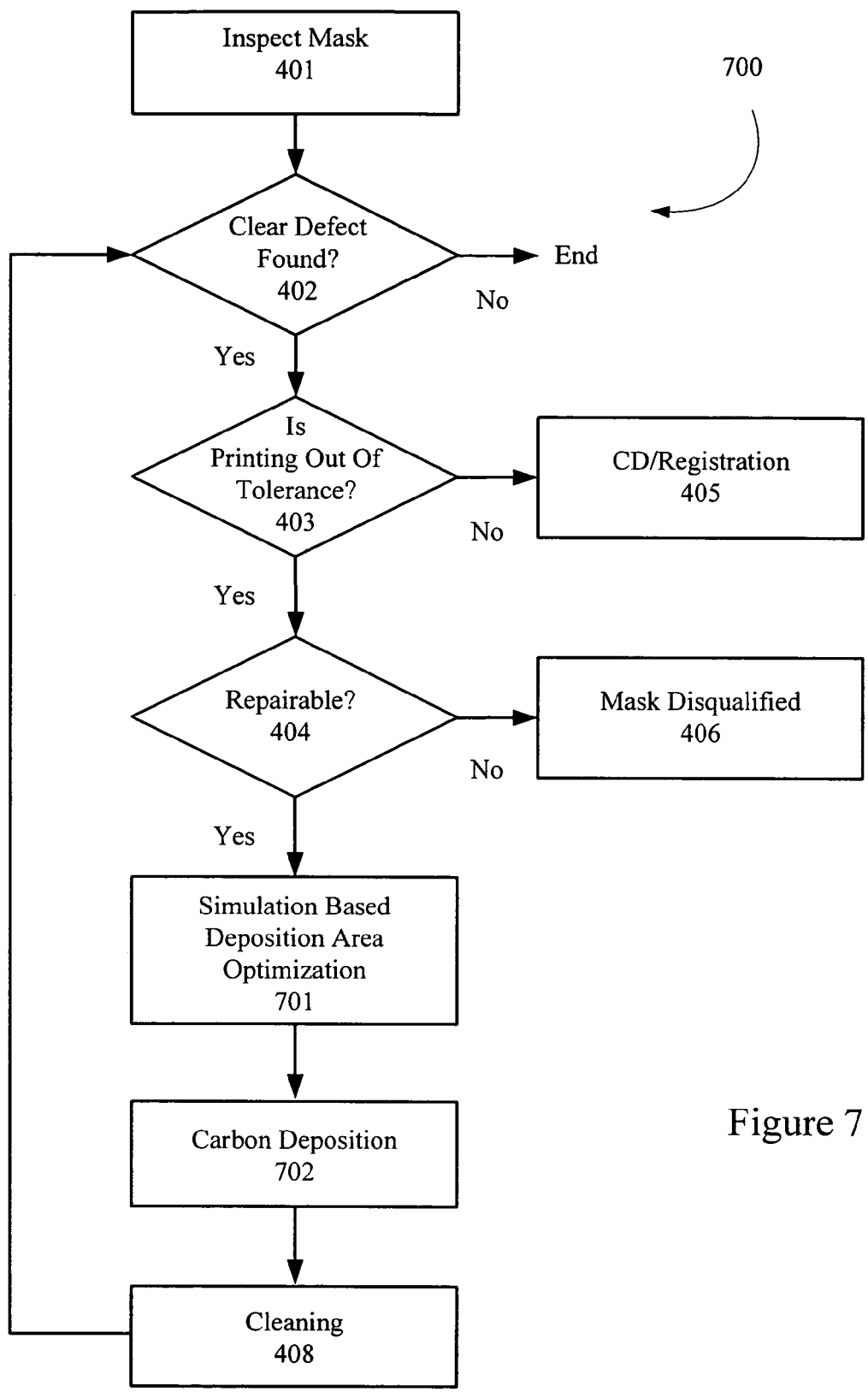
FIG. 7 illustrates an exemplary process for repairing clear defects on an attenuated PSM using a simulation based deposition area optimization.

In accordance with one feature of the invention, a proposed repair of a clear defect on an attenuated PSM can be simulated, thereby optimizing the repair solution before actual mask repair. FIG. 7 illustrates an exemplary process 700 for repairing a clear defect using simulation to optimize the deposition area. Process 700 includes steps 401-406 described in reference to FIG. 4A.

Of importance, after determining that the clear defect is repairable in step 404, the deposition area can be optimized using simulation in step 701. This optimization can include size and shape modifications (also explained in reference to FIG. 9), thereby significantly improving the probability that the printing will be in tolerance. Carbon deposition, as performed in step 702 during attenuated PSM repair, can advantageously include the optimized repair solution generated in step 701. Cleaning of the attenuated PSM can be done in step 408 (previously described in reference to FIG. 4A) before returning to step 402 to determine if another clear defect is identified.

A computer program product can be provided that implements and/or controls the steps performed in process 700. The computer program product can include a computer usable medium having a computer readable program code embodied therein for causing a computer to analyze a mask used in lithography for repair of a clear defect on the mask. The computer readable program code can include computer readable program code that simulates a repair solution to the clear defect, wherein the repair solution is based on a repair material having a transmission different than an original patterning material on the mask. The computer readable program code can further include computer readable program code that determines a size and/or a shape of the repair solution as well as computer readable program code that controls the depositing of the repair material on the attenuated PSM based on the size and/or shape of the repair solution.

Figure 8:
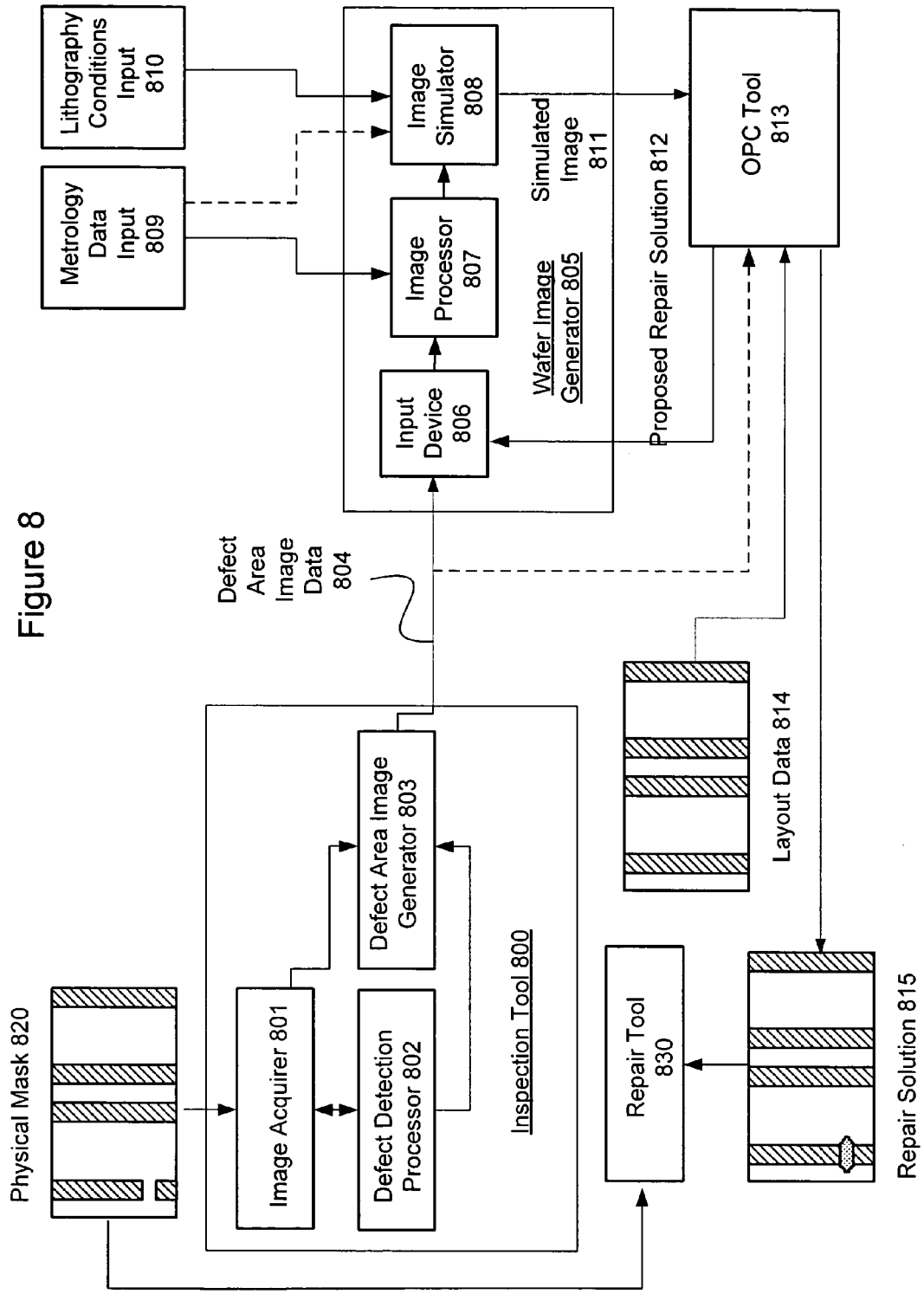
FIG. 8 illustrates an exemplary system that can be used to implement the inspection, simulation, and repair steps described in FIG. 7.

FIG. 8 illustrates an exemplary system that can be used to implement the inspection, simulation, and repair steps described in FIG. 7. In this system, an inspection tool 800 can analyze a physical mask 820, e.g. an attenuated PSM. In one embodiment, an image of physical mask 820 can be captured by a high resolution imaging device, such as a high resolution optical microscope, a scanning electron microscope (SEM), a focus ion beam, an atomic force microscope, or a near-field optical microscope, all of which are well known in the art of mask inspection. An image acquirer 801, such as a CCD camera, which is capable of interfacing with the particular type of microscope used, can digitize the image information from the microscope.

A defect detection processor 802 can compare the attenuated PSM images provided by image acquirer 801 to a set of potential defect criteria and determine what areas of the mask contain potential defects. In one embodiment, defect detection processor 802 can include a computer running a program of instructions and interfacing with image acquirer 801 such that the scanning of the mask is done in the desired manner. If a potential defect is discovered, defect detection processor 802 can signal a defect area image generator 803 to provide a defect area image 804 (also called defect area image data) of the area surrounding the potential defect.

In general, a wafer image generator 805, which receives defect area image 804, can include an input device 806, an image processor 807, and an image simulator 808. Input device 806 can be implemented by a digitizing device (if receiving defect area image data 804 directly) or any hardware suitable for reading the type of media upon which the image data is stored (if receiving defect area image data 804 indirectly from a storage device, not shown).

Image processor 807 can identify the intensity transitions of defect area image 804. For example, if image processor 807 identifies two intensities in defect area image 804, then a transition between these two intensities can define an edge of a feature in defect area image 804. In one embodiment, image processor 807 can also receive metrology data input 809 to more accurately interpret the intensity transition information. Specifically, metrology data input 809 can include data related to physical mask 820. For example, if physical mask 820 is an attenuated PSM, then metrology data input 809 can include certain data, such as the phase and the transmission, associated with the features on physical mask 820.

Image simulator 808 can include a computer-implemented program that receives defect area image 804 with intensity transition information from image processor 807, metrology data input 809 (in one embodiment), and other input data such as lithography conditions input 810 to simulate a wafer image of defect area image 804. Lithography conditions input 810 can include data that is specific to the lithography conditions and system parameters under which physical mask 820 is to be later exposed if it passes inspection. This data may include parameters such as the numerical aperture of the system (NA), the coherency value of the system (σ), the wavelength of the illumination being used in the system (λ), the defocus of the exposure, lens aberrations, substrate conditions, and the critical dimensions of the design among others. Further, lithography conditions input 810 may also include a range of these parameters such that the simulation can be performed a number of times for different combinations of these parameters. In this manner, the printability of a clear defect can be analyzed over a range of possible lithography conditions. U.S. patent application Ser. No. 09/130,996, filed on Aug. 7, 1998 by Numerical Technologies, Inc. and incorporated by reference herein, describes various implementations of inspection tool 800 and wafer image generator 805.

A simulated image 811 as well as layout data 814 (which corresponds to defect area image 804) can then be provided to an optical proximity correction (OPC) tool 813. OPC tool 813 can simulate a wafer image of layout data 814 and determine whether simulated image 811 is within tolerance compared to the ideal simulated image.

In one embodiment, OPC tool 813 could receive defect area image data 804 to modify layout data 814. Specifically, OPC tool 813 could use the information from defect area image data 804 to identify the area of the clear defect and then attempt to recreate defect area image data 804 from layout data 814. Advantageously, making OPC corrections to modified layout data 814, i.e. GDS II data including the clear defect, could be significantly easier than making the same corrections to defect area image data 804. In another embodiment, OPC tool 813 could convert defect area image data 804 into a GDS II format for further manipulation, i.e. edge dissection etc.

Of importance, OPC tool 813 can apply systematic changes to geometries of a data file (e.g. the modified layout data 814) to improve the printability of a wafer pattern. In model-based OPC, a real pattern transfer can be simulated (i.e. predicted) with a set of mathematical formulas (i.e. models). In model-based OPC, the edges of a feature can be dissected into a plurality of segments, thereby allowing those segments to be individually moved to correct for certain effects, e.g. the effects associated with the difference in transparency between the original mask pattern material and the repair material. The placement of the dissection points is determined by the feature shape, size, and/or position relative to other features. In some embodiments, a fixed dissection length can be used for edges, e.g. every N nm. In other embodiments, multiple dissection lengths are provided, e.g. inner corner, outer corner, etc.

Figure 9:
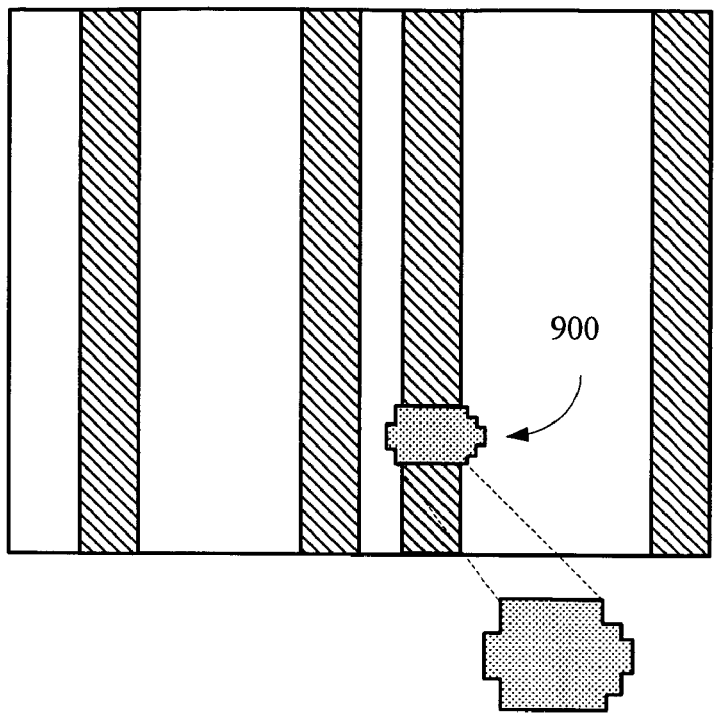
FIG. 9 illustrates an exemplary plug in which each of its exterior sides could have multiple dissection lengths, thereby allowing the size and shape of the plug to be adjusted. Determining the appropriate dissection lengths could be based on the proximity of other features to that edge.

In yet other embodiments, dissection lengths can be provided for edges of a plug for clear defects. In one embodiment, the dissection lengths can vary based on proximity effects in the layout. For example, FIG. 9 illustrates an exemplary plug 900 in which a right side has a step formation including more segments (i.e. shorter dissection lengths) than a left side. Determining dissection lengths could be based on the proximity of other features to that edge.

OPC tool 813 can perform an iterative process of moving one or more segments of the plug, i.e. the repair solution to the clear defect, until simulated image 811 is within tolerance of a simulation of layout data 814. Note that important edges on physical mask 820, e.g. edges associated with gates of a transistor, could have tighter tolerances than other less important edges. Note further that the resolution of a repair tool 830 could also be considered. Specifically, to take full advantage of the benefit of OPC tool 813, the resolution of repair tool 830 should be at least as small as the desired tolerance.

In one embodiment, wafer image generator 805 can be implemented using the Virtual Stepper® System set of tools and OPC tool 813 can be implemented using the iN-Tandem™ tool, both of which are licensed by Numerical Technologies, Inc. In another embodiment, the simulator of OPC tool 813 can be integrated into image simulator 808. Note that in either embodiment the simulator of OPC tool 813 and image simulator 808 can use optical or calibrated models, wherein optical models are based on accepted theoretical models whereas calibrated models are based on empirical data measured from actual wafers. In one embodiment, an end user or third party vendor could provide its calibrated models to a mask shop, thereby improving the accuracy of the simulated images.

OPC tool 813 can output a proposed repair solution 812, which can be provided to wafer image generator 805 to determine if the proposed repair results in a printed feature within tolerance. Simulation and moving of segments can continue until the proposed repair solution results in a printed feature within tolerance. This repair solution 815 can then be provided to repair tool 830 for actual repair of physical mask 820.

Advantageously, using the simulation based deposition area optimization, as described in FIGS. 7 and 8, allows the repair decision for an attenuated PSM to be made at the same time that inspection is done. In a conventional attenuated PSM repair process, after determining the printed feature corresponding to the clear defect is out of tolerance, but repairable, the mask is taken out of the production line for further analysis. Thus, a conventional process for repairing an attenuated PSM requires manual intervention by a human operator, thereby increasing the cost of the repair. In contrast, the simulation based deposition area optimization can be easily integrated into a fully automated repair process for an attenuated PSM, thereby significantly reducing the cost of repair compared to a conventional repair process.

Additionally, by using the simulation based deposition area optimization, the repair of clear defects on an attenuated PSM can be accurately analyzed before actual repair of the mask is performed. Therefore, the time allotted to mask repair can be significantly reduced compared to the "let's see if this works" repair process previously used for an attenuated PSM. Because a clear defect that is actually repaired using the simulation based deposition area optimization is known to be successful, more attenuated PSMs will be repaired rather than being rejected, thereby increasing the yield for this type of mask. Moreover, the more attenuated PSMs that can be successfully and quickly repaired increases the probability that mask shops will recommend the use of attenuated PSMs, thereby providing significant production advantages to the end users.

Figure 10:
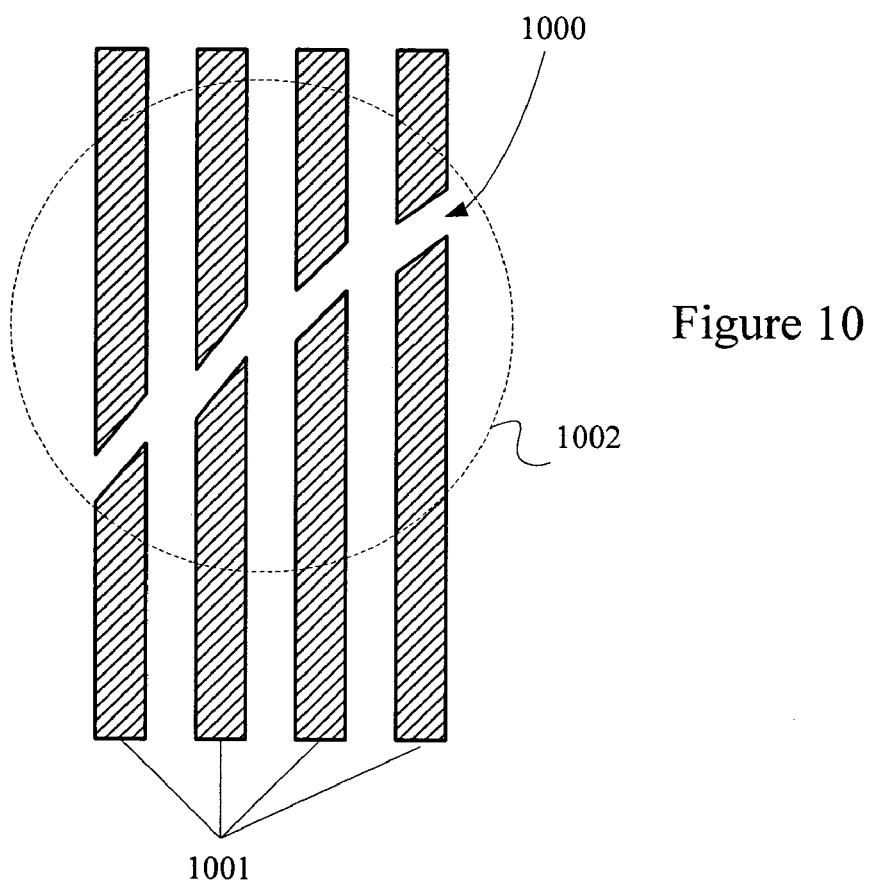
FIG. 10 illustrates a micro-scratch that results in multiple clear defects in adjacent lines. The repair solution for a clear defect in one line can take into consideration the proximity effects of adjacent repair solutions.

Note that clear defects may occur in a group, which can be more accurately analyzed together. For example, FIG. 10 illustrates a micro-scratch 1000 that results in multiple clear defects in lines 1001. The repair solution for a clear defect in one line should take into consideration the proximity effects of adjacent repair solutions. Therefore, in one embodiment, image acquirer 801 (FIG. 8) may use a "halo" 1002 to capture proximate clear defects. In this manner, the repair solution for micro-scratch 1000 could include the repair of all clear defects associated with lines 1001. In one embodiment, halo 1002 can have a radius of 4λ, i.e. 4 times the wavelength of the illumination being used in the system, to ensure that proximate clear defects are considered together. (Note that any opaque debris that is left on the mask as a result of the micro-scratch can be successfully removed using conventional defect removal processes. Therefore, such opaque defects do not need to be simulated.)

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, some masks, called tri-tone attenuated phase shifting masks, include an opaque region within the larger portion(s) of the attenuated, phase-shifting region. Forming an opaque region on an attenuated phase-shifting region advantageously allows for the use of a significantly higher optical intensity transmission coefficient for isolated structures. Typically, such an opaque region is formed using chrome, which as previously noted has an intensity transmission coefficient of T<0.01 (effectively 0% transmission). Therefore, in one embodiment, models used in image simulator 808 and/or OPC tool 813 can extend the same analysis used for these opaque regions to any clear defect repair solutions, i.e. any plugs having a similar intensity transmission coefficient (e.g. carbon plugs).

The materials used for clear, attenuated, and opaque regions can vary from mask to mask. For example, the transparent substrate can be formed of fused silica or borosilicate glass (used for wavelengths above 365 nanometers because of absorption at lower wavelengths), the attenuated layer can be formed of molybdenum silicide having a thickness between approximately 50 to 200 nanometers, and the opaque layer can be formed of chromium having a thickness between approximately 50 to 200 nanometers. In other embodiments, the attenuated layer can be formed from silicon nitride, aluminum oxide, molybdenum silicide, chrome oxy-nitride, chrome oxy-fluoride, zirconium silicide, or multi-layer materials such as silicon nitride/titanium nitride layers.

Of importance, the simulation based deposition area optimization can be applied to any clear defect in which the repair material has a different intensity transmission coefficient than the material used for patterning on the mask. In one embodiment, the deposition depth of the repair material can also be considered. In other words, if repair material changes in transmission based on its depth of deposition, then simulation could include determining the appropriate deposition depth to mimic the transmission of the original patterning material.

Note that the system and methods described herein can be applied to any lithographic process technology, including ultraviolet, deep ultraviolet (DUV), extreme ultraviolet (EUV), x-ray, ebeam, and ion beam. Accordingly, it is intended that the scope of the invention be defined by the following Claims and their equivalents.

The invention claimed is:

1. A system for repairing a clear defect on an attenuated phase shifting mask (PSM), the attenuated PSM including a pattern formed from an attenuated material, the system comprising:
   means for simulating a repair solution to the clear defect using optical proximity correction (OPC), the repair solution based on a carbon repair material having a transmission different than the attenuated material;
   means for determining at least one of a size and a shape of the repair solution; and
   means for depositing the repair material on the attenuated PSM.

2. The system of claim 1, wherein the repair solution includes a plug formed from the carbon repair material, and wherein the means for simulating includes means for dissecting edges of the plug into a plurality of segments and moving at least one segment to optimize at least one of the size and shape of the plug.

3. The system of claim 1, further including means for cleaning a surface of the attenuated PSM.

4. A system for repairing a clear defect on an attenuated phase shifting mask (PSM), the system comprising:
   means for simulating a repair solution to the clear defect using model-based optical proximity correction (OPC), the repair solution based on a carbon repair material having a transmission different than an attenuated material used for the attenuated PSM;
   means for determining a size and/or a shape of the repair solution based on the step of simulating; and
   means for depositing the carbon repair material on the attenuated PSM based on the determining.

5. The system of claim 4, wherein model-based OPO includes adjusting the repair solution based on proximity effects near the clear defect.

6. The system of claim 4, wherein the repair solution includes a plug formed from the carbon repair material, and wherein model-based OPC includes dissecting edges of the plug into a plurality of segments and moving at least one segment to optimize at least one of the size and shape of the plug.

7. The system of claim 4, further including means for cleaning a surface of the attenuated PSM.

8. The system of claim 4, wherein the attenuated material includes at least one of molybdenum silicide, silicon nitride, aluminum oxide, molybdenum silicide, chrome oxy-nitride, chrome oxy-fluoride, and zirconium suicide.

9. A system of determining a repair to be made to a clear defect on a mask, the mask including a pattern formed from a first material, the system comprising:
   means for simulating a repair solution to the clear defect using model-based optical proximity correction (OPC), the repair solution based on a carbon repair material having a transmission different than the first material; and
   means for determining a size and/or a shape of the repair solution based on simulating.

10. The system of claim 9, wherein model-based (OPC) includes means for adjusting the repair solution based on proximity effects near the clear defect.

11. The system of claim 9, wherein the repair solution includes a plug formed from the carbon repair material, and wherein model-based OPC includes dissecting edges of the plug into a plurality of segments and moving at least one segment to optimize at least one of the size and shape of the plug.

* * * * *